(12) United States Patent
Yamada et al.

(10) Patent No.: US 10,199,736 B2
(45) Date of Patent: Feb. 5, 2019

(54) WIRELESS DEVICE

(71) Applicant: Kabushiki Kaisha Toshiba, Minato-ku, Tokyo (JP)

(72) Inventors: Keiju Yamada, Yokohama Kanagawa (JP); Makoto Sano, Kawasaki Kanagawa (JP); Koh Hashimoto, Yokohama Kanagawa (JP); Makoto Higaki, Setagaya Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/664,669

(22) Filed: Jul. 31, 2017

(65) Prior Publication Data

US 2018/0226722 A1    Aug. 9, 2018

(30) Foreign Application Priority Data

Feb. 6, 2017    (JP) ................. 2017-019953

(51) Int. Cl.
*H01Q 13/10* (2006.01)
*H01Q 1/22* (2006.01)
(Continued)

(52) U.S. Cl.
CPC ......... *H01Q 13/10* (2013.01); *H01L 23/3114* (2013.01); *H01L 23/49534* (2013.01);
(Continued)

(58) Field of Classification Search
CPC ........ H01Q 13/10; H01Q 1/2283; H01Q 1/24; H01L 23/3114; H01L 23/49534; H01L 23/49541; H01L 23/552; H01L 23/66
See application file for complete search history.

(56) References Cited

U.S. PATENT DOCUMENTS 8,111,199 B2    2/2012 Baliarda et al.
8,487,433 B2    7/2013 Hasegawa et al.
(Continued)

FOREIGN PATENT DOCUMENTS

JP    H10-92981 A    4/1998
JP    2004-242034 A    8/2004
(Continued)

*Primary Examiner* — Hoang Nguyen

(74) *Attorney, Agent, or Firm* — Knobbe, Martens, Olson & Bear, LLP

(57) ABSTRACT

According to an embodiment, a wireless device includes an interposer, a semiconductor chip, electrodes, and a slot antenna. The interposer includes conductive layers disposed at least at a side of a component mounting surface and a side of a reverse surface opposite to the component mounting surface. The semiconductor chip is mounted on the component mounting surface and includes a built-in transceiving circuit. The electrodes are disposed in a conductive layer disposed at the side of the reverse surface of the interposer so as to be electrically connected to an outside of the wireless device. At least a portion of the slot antenna is disposed in at least one of the conductive layers of the interposer. A shortest distance between an end in a width direction of the slot antenna and the electrodes is smaller than a sum of a minimum line width and a minimum line space of the interposer.

5 Claims, 8 Drawing Sheets

(51) Int. Cl.
*H01L 23/31* (2006.01)
*H01L 23/495* (2006.01)
*H01L 23/552* (2006.01)
*H01L 23/66* (2006.01)
*H01Q 1/24* (2006.01)

(52) U.S. Cl.
CPC ...... *H01L 23/49541* (2013.01); *H01L 23/552* (2013.01); *H01L 23/66* (2013.01); *H01Q 1/2283* (2013.01); *H01Q 1/24* (2013.01); *H01L 2223/6677* (2013.01)

(56) References Cited

U.S. PATENT DOCUMENTS

| | | |
|---|---|---|
| 8,983,399 B2 | 3/2015 | Kawamura et al. |
| 9,166,298 B2 | 10/2015 | Hashimoto et al. |
| 9,793,202 B1 | 10/2017 | Hashimoto et al. |
| 2006/0033664 A1* | 2/2006 | Soler Castany ........ H01L 23/66 343/700 MS |
| 2009/0256752 A1 | 10/2009 | Akkermans et al. |
| 2011/0309893 A1* | 12/2011 | Kawamura ............. H01L 23/48 333/104 |
| 2012/0015687 A1* | 1/2012 | Yamada .............. H01L 23/3128 455/550.1 |
| 2012/0061826 A1 | 3/2012 | Hasegawa et al. |
| 2012/0248587 A1 | 10/2012 | Alleaume et al. |
| 2013/0222196 A1 | 8/2013 | Hashimoto et al. |
| 2014/0055939 A1 | 2/2014 | Hashimoto et al. |
| 2014/0325150 A1* | 10/2014 | Hashimoto ........... H01L 23/552 711/115 |
| 2018/0053987 A1 | 2/2018 | Yamada et al. |
| 2018/0205133 A1 | 7/2018 | Hashimoto et al. |

FOREIGN PATENT DOCUMENTS

| | | |
|---|---|---|
| JP | 2007-221585 A | 8/2007 |
| JP | 2013-179449 A | 9/2013 |
| JP | 2014-217014 A | 11/2014 |
| JP | 5710558 B2 | 4/2015 |
| JP | 2018-023060 | 2/2018 |
| JP | 2018-029286 | 2/2018 |
| JP | 2018-117215 A | 7/2018 |
| WO | WO 2010/058337 | 5/2010 |
| WO | WO 2010/079663 A1 | 7/2010 |

* cited by examiner

US 10,199,736 B2

WIRELESS DEVICE

CROSS-REFERENCE TO RELATED APPLICATIONS

This application is based upon and claims the benefit of priority from Japanese Patent Application No. 2017-019953, filed on Feb. 6, 2017; the entire contents of which are incorporated herein by reference.

FIELD

Embodiments described herein relate generally to a wireless device.

BACKGROUND

Conventionally, a method is known for having a slot antenna built into a semiconductor package in which a semiconductor chip is mounted on an interposer. Moreover, in order to add a shielding function to the semiconductor package, a technique for implementing a module with a built-in antenna has been proposed in which the surface of an sealing resin for sealing the semiconductor chip is covered using a conductive film; and a slot antenna is provided to extend from the conductive film meant for the shielding purpose, to a conductive layer of the interposer.

Generally, a slot antenna is configured as a non-conductive portion surrounded by conductive portions having ground potential. For example, a slot antenna is provided by forming a slit in a conductive layer having ground potential. In order to give an excellent radiation characteristic to the slot antenna, it is necessary that the slot antenna has a certain width. As a result, the space required for the slot antenna including the conductor pattern becomes relatively large. On the other hand, the conductive layers of the interposer have a high wiring density attributed to the wiring such as signal wiring and power supply wiring. Hence, in the case of providing the slot antenna in a conductive layer of the interposer, it is difficult in the conventional technology to achieve downsizing of the interposer while maintaining the radiation characteristic of the slot antenna. Hence, there is a demand for improvement in that regard.

DETAILED DESCRIPTION

Figure 1:
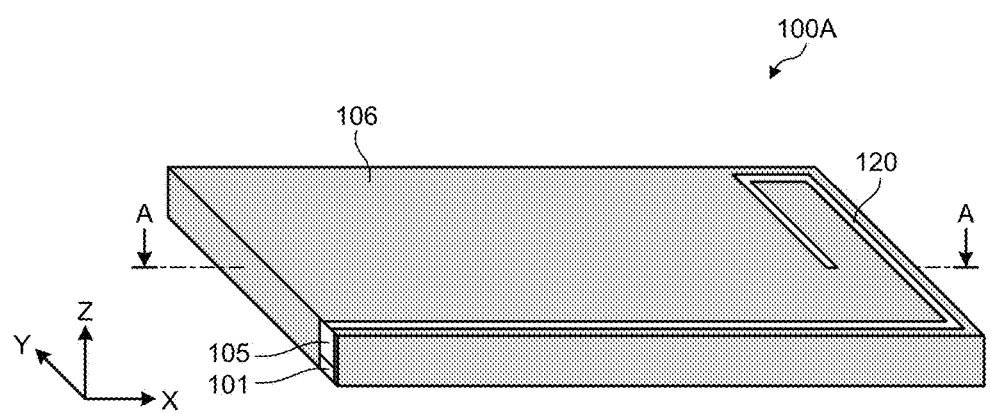
FIG. 1 is a perspective view of the external appearance of a wireless device according to a first embodiment.

According to an embodiment, a wireless device includes an interposer, a semiconductor chip, a plurality of electrodes, and a slot antenna. The interposer includes conductive layers disposed at least at a side of surface mounting components and a side of a reverse surface which is opposite to the surface mounting component. The semiconductor chip is mounted on the component mounting surface of the interposer and includes a built-in transceiving circuit. The electrodes are disposed in a conductive layer disposed at the side of the reverse surface of the interposer so as to be electrically connected to an outside of the wireless device. At least a portion of the slot antenna is disposed in at least one of the conductive layers of the interposer. A shortest distance between an end in a width direction of the slot antenna and the plurality of electrodes is smaller than a sum of a minimum line width and a minimum line space of the interposer.

Embodiments of a wireless device are described below in detail with reference to the accompanying drawings. In the following explanation, the constituent elements having identical functions are referred to by the same reference numerals, and the redundant explanation is not repeated.

First Embodiment

Figure 2:
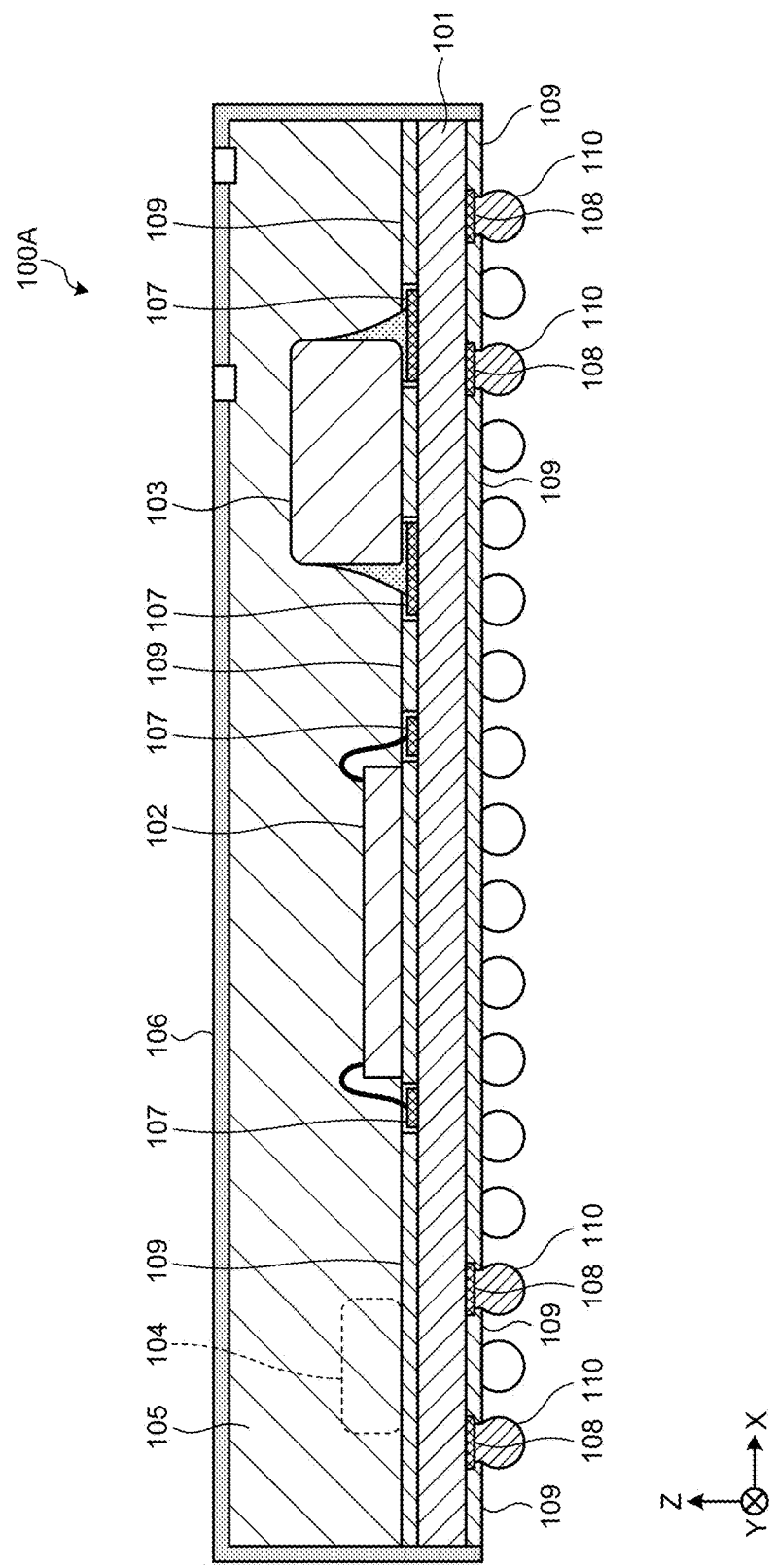
FIG. 2 is a cross-sectional view of the cross-section that runs along A-A line illustrated in FIG. 1 and that is viewed from the Y direction illustrated in FIG. 1.
Figure 3:
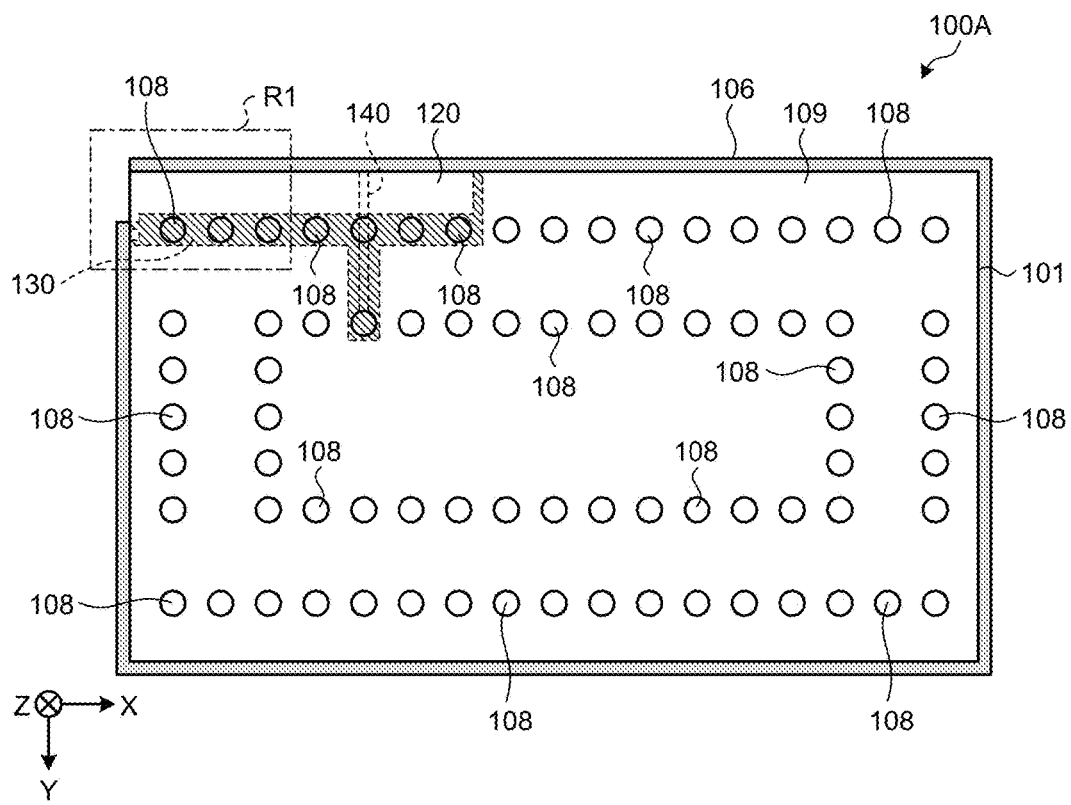
FIG. 3 is a planar view of an interposer when viewed from the reverse surface side.
Figure 4:
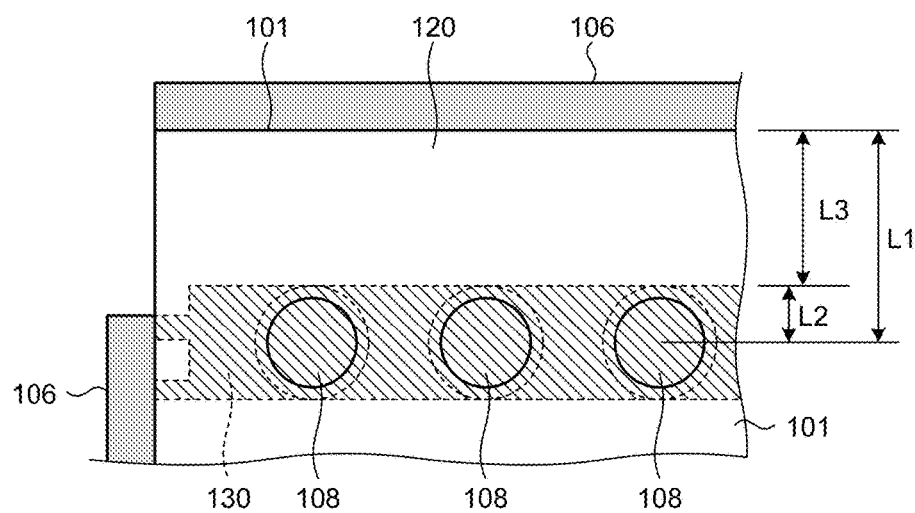
FIG. 4 is a diagram illustrating an R1 portion, which is illustrated in FIG. 3, in an enlarged manner.
Figure 5:
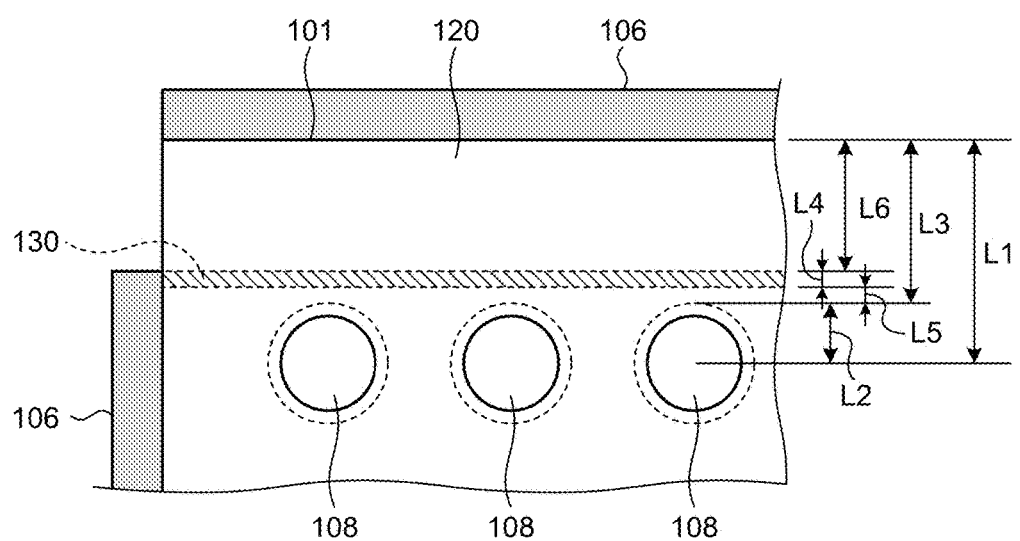
FIG. 5 is a diagram illustrating a comparative example.

Firstly, explained below with reference to FIGS. 1 to 5 is a wireless device 100A according to a first embodiment. FIG. 1 is a perspective view of the external appearance of the wireless device 100A according to the first embodiment. FIG. 2 is a cross-sectional view of the cross-section that runs along A-A line illustrated in FIG. 1 and that is viewed from the Y direction illustrated in FIG. 1. FIG. 3 is a planar view of an interposer 101 when viewed from the reverse surface side. FIG. 4 is a diagram illustrating an R1 portion, which is illustrated in FIG. 3, in an enlarged manner. FIG. 5 is a diagram illustrating a comparative example.

The wireless device 100A according to the first embodiment is configured in the following manner: electronic components such as a semiconductor chip 102, a chip capacitor 103, and a crystal oscillator 104 that are mounted on the interposer 101 are sealed using a sealing resin 105; and the surfaces of the sealing resin 105 and the side surfaces of the interposer 101 are covered by a conductive film 106. The wireless device 100A having such a configuration is called a semiconductor package or a semiconductor module with a shielding function. Meanwhile, the wireless device 100A can also be configured without using the sealing resin 105 and the conductive film 106. Moreover, only the semiconductor chip 102 can be mounted as the electronic component on the interposer 101.

The interposer 101 is a substrate obtained by forming a plurality of conductive layers on an insulating base material using a metal such as copper; and functions as a linking member for connecting the electronic components, such as the semiconductor chip 102, mounted thereon to a larger circuit board on which the wireless device 100A is mounted.

The interposer 101 includes conductive layers disposed at least at a side of a component mounting surface, on which the electronic components such as the semiconductor chip 102 are mounted, and at a side of a reverse surface (i.e., a surface to face the circuit board) which is opposite to the component mounting surface. Alternatively, the interposer 101 can have a multilayered structure in which one or more conductive layers are further disposed in between the two conductive layers mentioned above.

In the conductive layer disposed at the side of the component mounting surface of the interposer 101, a wiring pattern 107 is disposed to which the electronic components such as the semiconductor chip 102 are connected. Moreover, in the conductive layer disposed at the side of the reverse surface of the interposer 101, for example, a plurality of electrodes 108 are disposed, which are electrically connected to the outside of the wireless device 100A, such as to the circuit board, via solder balls 110. The electrodes 108 include electrodes used for communicating signals with the circuit board (also including electrodes used for applying the power-supply voltage) and includes electrodes having ground potential; and are connected to the wiring pattern 107 disposed at the side of the component mounting surface of the interposer 101, via conductive via holes that are formed in a penetrating manner in the thickness direction of the interposer 101. In the conductive layers of the interposer 101, at the positions where the wiring pattern 107 and the electrodes 108 are not disposed, a solder resist 109 is applied to achieve electrical insulation.

The semiconductor chip 102 has a metallic pattern of copper, aluminum, or gold formed on the inside or on the surface layer of a semiconductor substrate made of a material such as silicon, silicon germanium, gallium arsenide, or gallium nitride; and has a built-in transceiving circuit for transmitting and receiving signals. The semiconductor chip 102 is mounted on the component mounting surface of the interposer 101; and is electrically connected to the wiring pattern 107, which is disposed at the side of the component mounting surface, via bonding wires or bumps.

Alternatively, the semiconductor chip 102 can be configured as a chip size package (CSP). Meanwhile, in FIG. 2, although it is illustrated that a single semiconductor chip 102 is mounted on the interposer 101, it is also possible to have a plurality of semiconductor chips 102 mounted on the interposer 101. In that case, the semiconductor chips 102 either can be stacked or can be horizontally arranged.

The sealing resin 105 is made of, for example, a thermosetting molding compound having epoxy resin as the base with silica filler added thereto; and is placed on the component mounting surface of the interposer 101 for the purpose of protecting the electronic components such as the semiconductor chip 102 mounted on the component mounting surface of the interposer 101, and thus seals the electronic components such as the semiconductor chip 102. Herein, the sealing resin 105 is an example of an insulator used for sealing the electronic components such as the semiconductor chip 102. However, the insulator is not limited to resin, and some other insulating material can alternatively be used.

The conductive film 106 is either made of metal with high conductivity such as copper, silver or conductive paste that is a mixture of a metal such as silver and an insulating material such as epoxy resin; and is formed as a film for covering the surfaces (the outside surfaces) of the sealing resin 105 and the side surfaces of the interposer 101. Thus, in the wireless device 100A according to the first embodiment, the whole circumference of the interposer 101, excluding the reverse surface thereof, is covered by the conductive film 106. In the present specification, the surface of the conductive film 106 facing the component mounting surface of the interposer 101 is called the principal surface portion of the conductive film 106. Moreover, the surfaces of the conductive film 106 facing the side surfaces of the interposer 101 are called the side surface portions of the conductive film 106.

Meanwhile, although not illustrated in the drawings, in between the sealing resin 105 and the conductive film 106, an underlayer made of stainless-steel or titanium is formed with the aim of preventing abrasion of the conductive film 106. Moreover, on the surface of the conductive film 106, a protective layer made of stainless steel or titanium is formed with the aim of preventing oxidation or corrosion.

The conductive film 106 has a shielding function by which the high-frequency electromagnetic waves (in the range of few tens of MHz to few GHz) that are generated primarily from the semiconductor chip 102 are prevented from leaking radiation noise to the outside of the wireless device 100A. The shielding effectiveness attributed to the conductive film 106 is dependent on the sheet resistance obtained by dividing the resistivity of the conductive film 106 by the thickness thereof. In order to reproducibly prevent the radiation noise leakage, it is desirable that the conductive film 106 have the sheet resistance to be equal to or smaller than 0.5 Ω.

Moreover, the conductive film 106 is electrically connected to a conductive portion having ground potential in one of the conductive layers of the interposer 101. That is, since the conductive film 106 covers not only the surfaces of the sealing resin 105 but also the side surfaces of the interposer 101, it makes contact with a conductive portion having ground potential on the side surface of the interposer 101 and gets electrically connected to the conductive portion. As a result of a low-resistance connection of the conductive film 106 to the conductive portion having ground potential in the interposer 101, a potent shielding effectiveness can be achieved.

In the wireless device 100A according to the first embodiment, a single slot antenna 120 is disposed across the principal surface portion of the conductive film 106, the side surface portion of the conductive film 106, and the conductive layer disposed at side of the reverse surface of the interposer 101. The slot antenna 120 represents a slit-like insulating portion surrounded by the conductive portion having ground potential. In the wireless device 100A according to the first embodiment, the insulating portion formed by cutting a slit from the principal surface portion of the conductive film 106 over to the side surface portion thereof is in continuation with the insulating portion disposed in the conductive layer at the side of the reverse surface of the interposer 101, to constitute a single slot antenna 120. The total length of the slot antenna 120, that is, the length (slot length) from one end of the slot antenna 120 in the principal surface portion of the conductive film 106 to the other end of the slot antenna 120 in the conductive layer disposed at the side of the reverse surface of the interposer 101 is set to be approximately equal to the half wavelength of the desired frequency used for communication by the wireless device 100A.

Moreover, in the wireless device 100A according to the first embodiment, in the conductive layer at the side of the component mounting surface of the interposer 101, an antenna feeder 140 (see FIG. 3) connected to the semiconductor chip 102 is disposed in an intersecting manner with the insulating portion (a part of the slot antenna 120) in the conductive layer at the side of the reverse surface of the interposer 101. When electromagnetic-field-coupling-type power feeding is received from the antenna feeder 140, the slot antenna 120 becomes able to radiate or receive electromagnetic waves of the desired frequency in an efficient manner.

As illustrated in FIG. 3, a part of the slot antenna 120, which is disposed in the conductive layer at the side of the reverse surface of the interposer 101, is formed of a insulating portion between a conductor pattern 130, which has ground potential and which is disposed at a distance from the side surface of the interposer 101, and the side surface portion of the conductive film 106. That is, regarding the slot antenna 120 in the conductive layer disposed at the side of the reverse surface of the interposer 101, one end in the width direction makes contact with the conductor pattern 130 and the other end in the width direction makes contact with the side surface portion of the conductive film 106.

With such a configuration of the slot antenna 120 in the conductive layer disposed at the side of the reverse surface of the interposer 101, the space occupied by the conductor pattern 130 can be reduced as compared to the case in which a slit is formed in the conductor pattern 130 and is treated as a part of the slot antenna 120. The interposer 101 has a high wiring density attributed to the wiring such as signal wiring and power supply wiring. For that reason, if a large space is occupied by the conductor pattern 130 as required for disposing the slot antenna 120, then it leads to an increase in size of the interposer 101. Hence, using the side surface portion of the conductive film 106 to form a part of the slot antenna 120 is helpful in achieving downsizing of the interposer 101 and eventually achieving downsizing of the wireless device 100A.

In the conductive layer disposed at the side of the reverse surface of the interposer 101, a plurality of electrodes 108 are disposed that include electrodes used for communicating signals with the outside of the wireless device 100A (i.e., with the circuit board mentioned above) (hereinafter, such electrodes are called signal pins) and includes electrodes having ground potential (hereinafter, called ground pins). With respect to the size and the arrangement of the electrodes 108 in the interposer 101, there is the standard of, for example, the Joint Electron Device Council (JEDEC). In order to manufacture the wireless device 100A at low cost, it is desirable to use the interposer 101 having the size and the arrangement of the electrodes 108 that conform to a standard.

In the interposer 101 having the size and the arrangement of the electrodes 108 that conform to a standard; for example, as illustrated in FIG. 4, a distance L1 from the side surface of the interposer 101 to the center of the electrodes 108 that are disposed in the vicinity to the side surface is a defined value, as well a radius L2 of the electrodes 108 is a defined value. Thus, in the case in which the slot antenna 120 in the conductive layer disposed at the side of the reverse surface of the interposer 101 is to be configured using the insulating portion between the conductor pattern 130 and the side surface portion of the conductive film 106; the slot antenna 120 needs to be disposed within a distance L3 that is obtained by subtracting the defined value L2 from the defined value L1.

As a comparative example, consider a case in which the electrodes 108 that are positioned in the vicinity of the slot antenna 120 are allocated as signal pins. In that case, as illustrated in FIG. 5, the conductor pattern 130, which has ground potential and which makes contact with one end in the width direction of the slot antenna 120, needs to be disposed at a distance from the electrodes 108 positioned in the vicinity of the slot antenna 120. Thus, the conductor pattern 130 is disposed at the side surface side of the interposer 101 and requires, at the minimum, a space equivalent to the sum of a minimum line width L4 and a minimum line space L5 of the interposer 101. As a result, the shortest distance between an end in the width direction of the slot antenna 120 and the electrodes 108 becomes equal to or greater than the sum of the minimum line width L4 and the minimum line space L5 (equal to or greater than L4+L5) of the interposer 101. For that reason, the width of the slot antenna 120 is limited to a size L6 that is obtained by subtracting the values L4 and L5 from the value L3.

In this way, in the comparative example, the width of the slot antenna 120 is limited, and there is concern about a decline in the radiation characteristic of the slot antenna 120. Moreover, when downsizing of the interposer 101 is attempted, the width of the slot antenna 120 becomes further shorter, and the decline in the radiation characteristic becomes prominent.

In contrast, in the wireless device 100A according to the first embodiment, the electrodes 108 that are positioned in the vicinity of the slot antenna 120 are allocated as ground pins. As a result, as illustrated in FIGS. 3 and 4, the conductor pattern 130, which has ground potential and which makes contact with one end in the width direction of the slot antenna 120, can be disposed in an overlapping manner with the electrodes 108 positioned in the vicinity of the slot antenna 120. That is, the electrodes 108 positioned in the vicinity of the slot antenna 120 can double as a part of the conductor pattern 130 having ground potential.

Thus, in the wireless device 100A according to the first embodiment, unlike in the comparative example, the space equivalent to the sum of the minimum line width L4 and the minimum line space L5 (i.e., equivalent to L4+L5) of the interposer 101 need not be secured in between the electrodes 108 positioned in the vicinity of the slot antenna 120 and the slot antenna 120. That is, the shortest distance between the an end in the width direction of the slot antenna 120 and the electrodes 108 can be set to be smaller than the sum of the minimum line width L4 and the minimum line space L5 (i.e., smaller than L4+L5) of the interposer 101; and the width of the slot antenna 120 can be increased by the equivalent amount and the radiation characteristic thereof can be enhanced. Moreover, downsizing of the interposer 101 can be achieved while maintaining the radiation characteristic of the slot antenna 120.

The wireless device 100A according to the first embodiment described above is configured as, for example, a package or a module having the ball grid array (BGA) structure in which terminals formed by the solder balls 110 are disposed on the reverse surface of the interposer 101. Alternatively, the wireless device 100A can be configured as a package or a module having land grid array (LGA) structure in which the electrodes 108 disposed at the side of the reverse surface of the interposer 101 are used as terminals, without disposing terminals of the solder balls 110. In the case of a BGA structure, the opening of the solder mask 109 often has a smaller diameter than the diameter of the electrodes 108, thereby resulting in an over-resist configuration. In contrast, in the case of an LGA structure, the opening of the solder mask 109 often has a greater diameter than the diameter of the electrodes 108, thereby resulting in a clearance-resist configuration. Meanwhile, in FIGS. 1 to 4, although the wireless device 100A is illustrated to have a quadrangular planar shape, the outer shape of the wireless device 100A is not limited to this example, and it is possible to have the wireless device 100A in various shapes.

As described above, in the wireless device 100A according to the first embodiment, the shortest distance between an end in the width direction of the slot antenna 120, which is disposed in the conductive layer disposed at the side of the reverse surface of the interposer 101, and the electrodes 108, which are disposed in the conductive layer disposed at the side of the reverse surface of the interposer 101, is smaller than the sum of the minimum line width and the minimum line space of the interposer 101. Hence, the slot antenna 120 can be disposed in an efficient manner in the conductive layer disposed at the side of the reverse surface of the interposer 101, and downsizing of the interposer 101 can be achieved while sufficiently securing the width of the slot antenna 120 and maintaining the radiation characteristic thereof.

Moreover, in the wireless device 100A according to the first embodiment, the single slot antenna 120 is disposed across the principal surface portion of the conductive film 106, the side surface portion of the conductive film 106, and the conductive layer disposed at the side of the reverse surface of the interposer 101. Hence, the slot antenna 120 having a large slot length can be disposed while achieving downsizing of the interposer 101, and thus an antenna of a relatively low frequency can be mounted.

Furthermore, in the wireless device 100A according to the first embodiment, the insulating portion between the conductor pattern 130, which has ground potential and which is disposed at a distance from the side surface of the interposer 101, and the side surface portion of the conductive film 106 constitutes the slot antenna 120 that is disposed in the conductive layer disposed at the side of the reverse surface of the interposer 101. As a result, as compared to the case in which a slit is formed in the conductor pattern 130 and is treated as the slot antenna 120, the space occupied by the conductor pattern 130 can be reduced. That gives an advantage while downsizing the interposer 101.

First Modification

In the wireless device 100A according to the first embodiment, a part of the slot antenna 120 is disposed in the conductive layer disposed at the side of the reverse surface of the interposer 101. However, the conductive layer in which a part of the slot antenna 120 is to be disposed is not limited to the conductive layer disposed at the side of the reverse surface. Alternatively, a part of the slot antenna 120 can be disposed in the conductive layer disposed at the side of the component mounting surface of the interposer 101, or a part of the slot antenna 120 can be disposed in not only the conductive layer disposed at the side of the component mounting surface of the interposer 101 but also the conductive layer disposed at the side of the reverse surface of the interposer 101. Meanwhile, in the case of using the interposer 101 having a multilayered structure in which a separate layer (an intermediate layer) is formed between the component mounting surface and the reverse surface, a part of the slot antenna 120 can be disposed in the intermediate layer.

Figure 6:
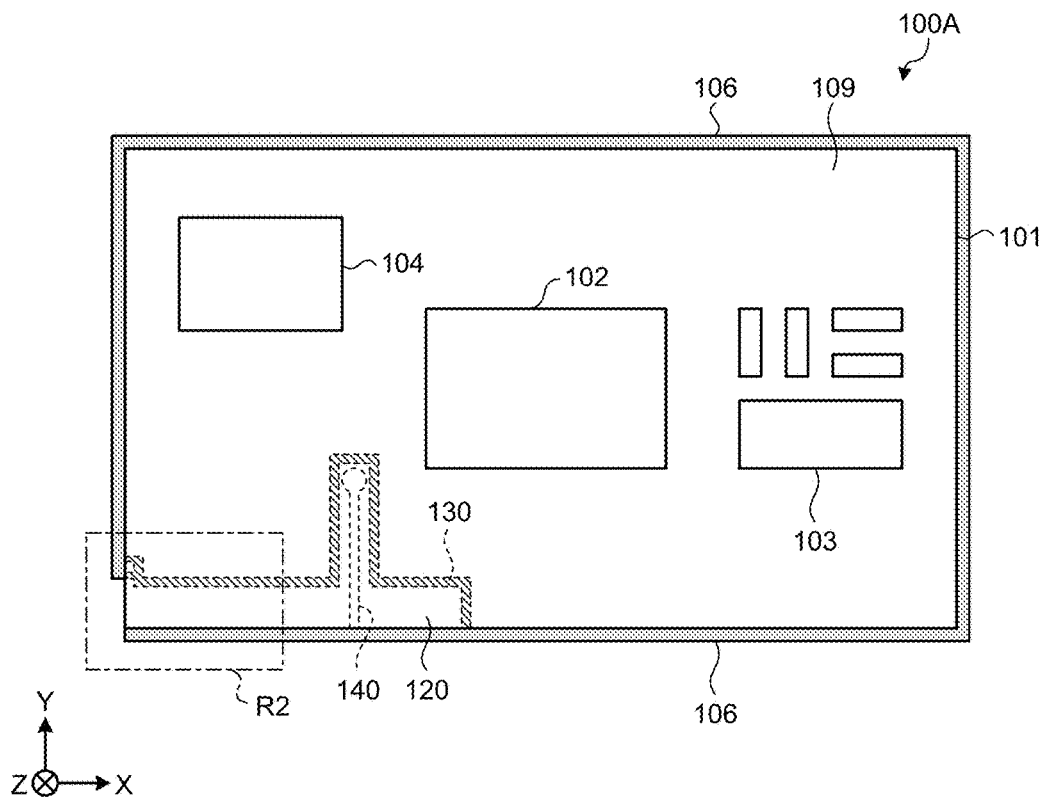
FIG. 6 is a planar view of the interposer according to a first modification when viewed from the component mounting surface side.
Figure 7:
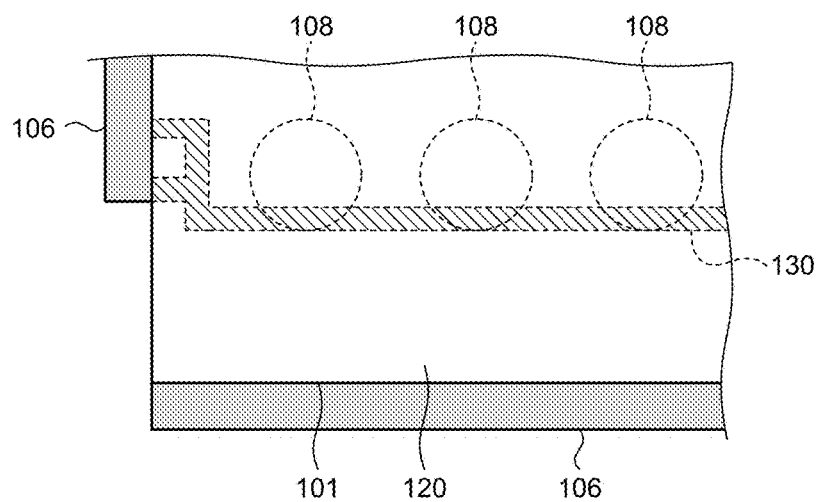
FIG. 7 is a diagram illustrating an R2 portion, which is illustrated in FIG. 6, in an enlarged manner.

FIGS. 6 and 7 are diagrams for explaining an example in which a part of the slot antenna 120 is disposed in the conductive layer disposed at the side of the component mounting surface of the interposer 101. FIG. 6 is a planar view of the interposer 101 according to the first modification when viewed from the component mounting surface side. FIG. 7 is a diagram illustrating an R2 portion, which is illustrated in FIG. 6, in an enlarged manner. Meanwhile, in FIG. 6, the wiring pattern 107, which is connected to the electronic components such as the semiconductor chip 102, is not illustrated.

In the case of disposing a part of the slot antenna 120 in the conductive layer formed at the side of the component mounting surface of the interposer 101; for example, as illustrated in FIGS. 6 and 7, the conductor pattern 130 having ground potential is disposed at the conductive layer formed at the side of the component mounting surface but at a distance from the side surface of the interposer 101, and is electrically connected to the side surface portion of the conductive film 106. Then, the insulating portion between the conductor pattern 130, which has ground potential and which is disposed in the conductive layer formed at the side of the component mounting surface of the interposer 101, and the side surface portion of the conductive film 106 is set to constitute a part of the slot antenna 120. That is, regarding the slot antenna 120 that is disposed in the conductive layer formed at the side of the component mounting surface of the interposer 101; one end in the width direction makes contact with the conductor pattern 130, and the other end in the width direction makes contact with the side surface portion of the conductive film 106.

Moreover, in the conductive layer formed at the side of the component mounting surface of the interposer 101, the antenna feeder 140 connected to the semiconductor chip 102 is disposed in an intersecting manner with the slot antenna 120. When coplanar power supply is received from the antenna feeder 140, the slot antenna 120 becomes able to radiate or receive electromagnetic waves of the desired frequency in an efficient manner. Meanwhile, as illustrated in FIG. 6, a part of the conductor pattern 130 is pulled around the antenna feeder 140. With that, such a portion can be made to function as side grounding.

In the first modification too, from among the electrodes 108 disposed in the conductive layer formed at the side of the reverse surface of the interposer 101, the electrodes 108 positioned in the vicinity of the slot antenna 120 are allocated as ground pins. As a result, the conductor pattern 130 can be disposed in such a manner that the orthogonal projection thereof overlaps with the electrodes 108 in the vicinity of the slot antenna 120; and the shortest distance between an end in the width direction of the slot antenna 120 and the electrodes 108 can be set to be smaller than the sum of the minimum line width and the minimum line space of the interposer 101. Thus, the width of the slot antenna 120 can be increased by the equivalent amount and the radiation characteristic thereof can be enhanced. Moreover, downsizing of the interposer 101 can be achieved while maintaining the radiation characteristic of the slot antenna 120.

As described above, in the first modification too, the shortest distance between the an end in the width direction of the slot antenna 120, which is disposed in the conductive layer disposed at the side of the component mounting surface of the interposer 101, and the electrodes 108, which are disposed in the conductive layer formed at the side of the reverse surface of the interposer 101, can be set to be smaller than the sum of the minimum line width and the minimum line space of the interposer 101. As a result, the slot antenna 120 can be disposed in an efficient manner on the conductive layer disposed at the side of the component mounting surface of the interposer 101, and downsizing of the interposer 101 can be achieved while sufficiently securing the width of the slot antenna 120 and maintaining the radiation characteristic thereof.

Second Modification

In the wireless device 100A described above, all electrodes 108 positioned in the vicinity of the slot antenna 120 are allocated as ground pins. Alternatively, the configuration can be such that some of the electrodes 108 positioned in the vicinity of the slot antenna 120 are allocated as ground pins, and the width of the slot antenna 120 is increased in the neighborhood of the electrodes 108 serving as ground pins.

Figure 8:
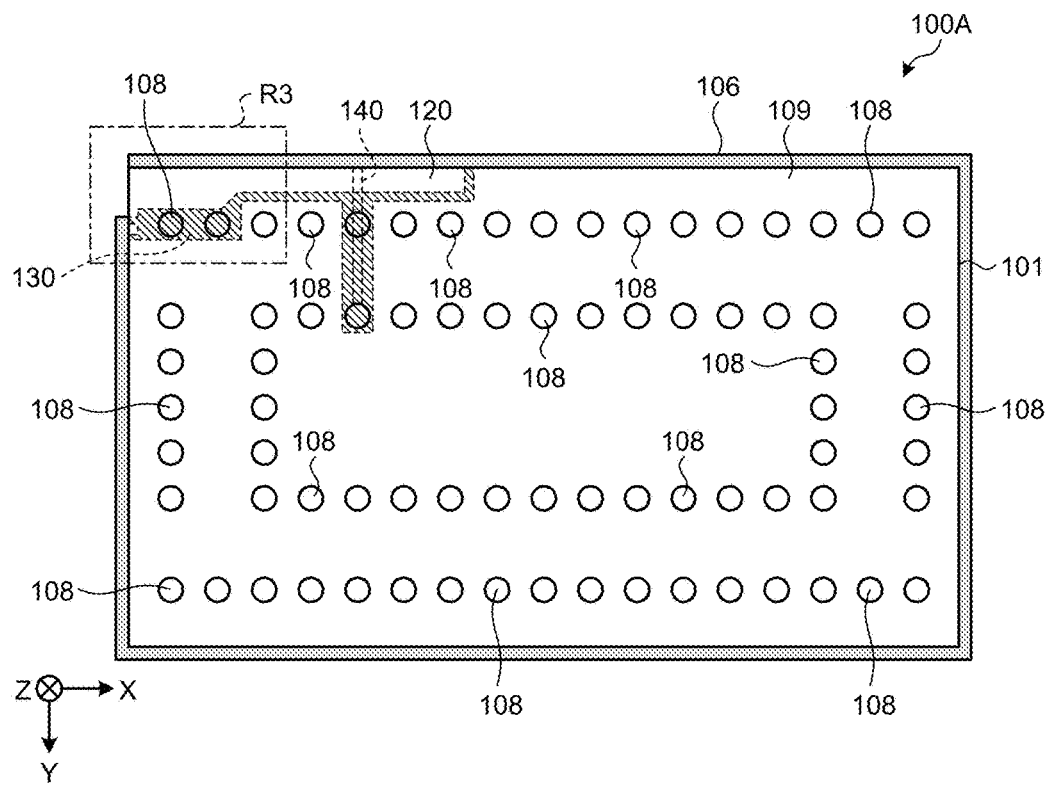
FIG. 8 is a planar view of the interposer according to a second modification when viewed from the reverse surface side.
Figure 9:
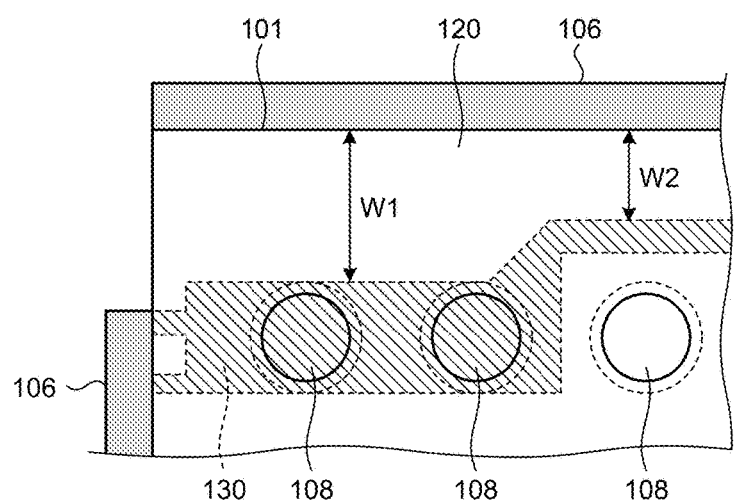
FIG. 9 is a diagram illustrating an R3 portion, which is illustrated in FIG. 8, in an enlarged manner.

FIGS. 8 and 9 are diagrams for explaining the second modification. FIG. 8 is a planar view of the interposer 101 according to the second modification when viewed from the reverse surface side. FIG. 9 is a diagram illustrating an R3 portion, which is illustrated in FIG. 8, in an enlarged manner. In the second modification, some of the electrodes 108 positioned in the vicinity of the slot antenna 120 are allocated as ground pins and, as illustrated in FIGS. 8 and 9, a width W1 of the slot antenna 120 in the neighborhood of the electrodes 108 serving as ground pins (in FIG. 9, two electrodes 108 on the left-hand side) is increased to be greater than a width W2 of the slot antenna 120 at other positions.

As described in the second modification, in the configuration in which the width of the slot antenna 120 is varied, it is desirable that the width is increased in the portion close to the stomach of the slot antenna 120 (i.e., the central part in the length direction in which the standing waves increase in amplitude). As a result, while maintaining the radiation characteristic of the slot antenna 120 at an excellent level, in the portion close to the nodes (i.e., the ends in the length direction at which the standing waves decrease in amplitude), the electrodes 108 positioned in the vicinity of the slot antenna 120 can be allocated as signal pins.

As described above, in the second modification, on the conductive layer formed at the side of the reverse surface of the interposer 101, a part of the slot antenna 120 is disposed from the neighborhood of the electrodes 108 serving as ground pins to the neighborhood of the electrodes 108 serving as signal pins, and the width of the slot antenna 120 is varied. Hence, the number of electrodes 108 that can be used as signal pins can be increased while maintaining the radiation characteristic of the slot antenna 120 at an excellent level. With that, the number of electrodes 108 required in the interposer 101 can be reduced, thereby enabling achieving reduction in the cost of the interposer 101.

Meanwhile, in the explanation given above, a part of the slot antenna 120 is disposed in the conductive layer formed at the side of the reverse surface of the interposer 101. However, in an identical manner to the first modification, a part of the slot antenna 120 can be disposed in any one of the conductive layers, such as in the conductive layer formed at the side of the component mounting surface of the interposer 101.

Third Modification

Figure 10:
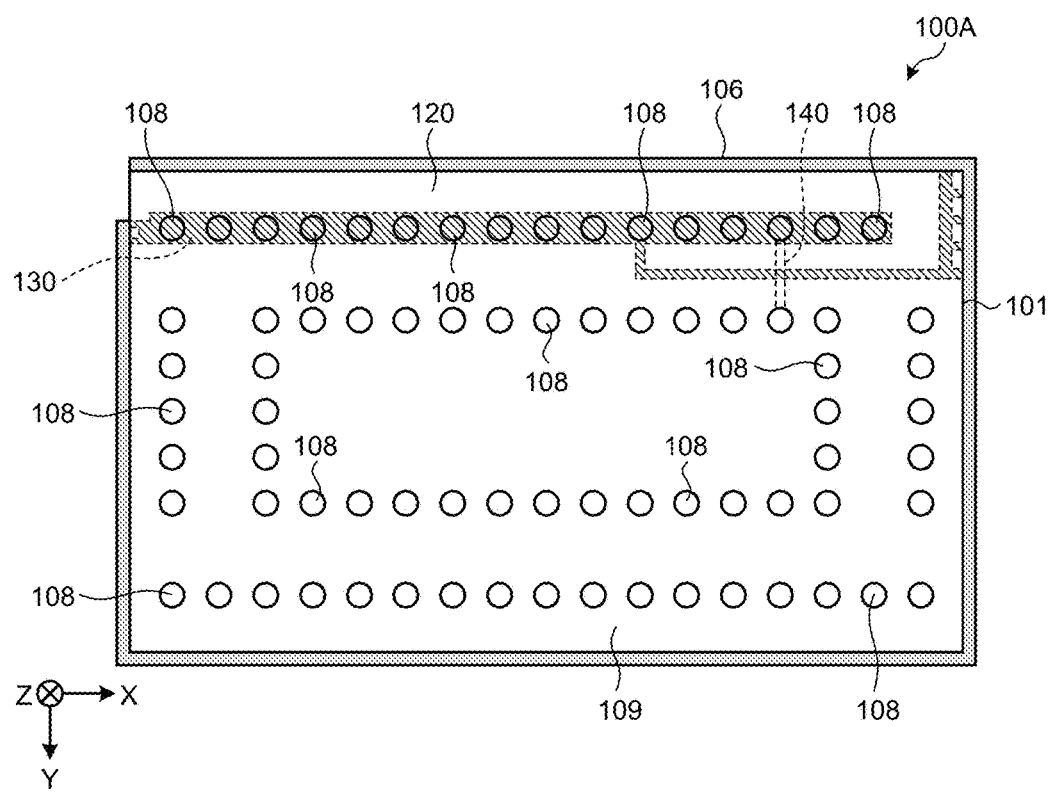
FIG. 10 is a planar view of the interposer according to a third modification when viewed from the reverse surface side.

In the wireless device 100A explained below, a part of the slot antenna 120, which is disposed in a conductive layer of the interposer 101, is assumed to be linear in shape. Alternatively, a part of the slot antenna 120 that is disposed in a conductive layer of the interposer 101 can have various shapes. For example, as illustrated in FIG. 10, a part of the slot antenna 120 that is disposed in a conductive layer of the interposer 101 can be bent and turned back midway along the length direction, so that the slot antenna 120 having an adequate length can be disposed in a conductive layer of the interposer 101 having limited dimensions. Hence, an antenna of a relatively low frequency can be mounted while achieving downsizing of the interposer 101.

Fourth Modification

In the wireless device 100A explained above, the single slot antenna 120 is disposed across the principal surface portion of the conductive film 106, the side surface portion of the conductive film 106, and a conductive layer of the interposer 101. Alternatively, the configuration can be such that the slot antenna 120 is disposed in only one of the conductive layers of the interposer 101.

Second Embodiment

Figure 11:
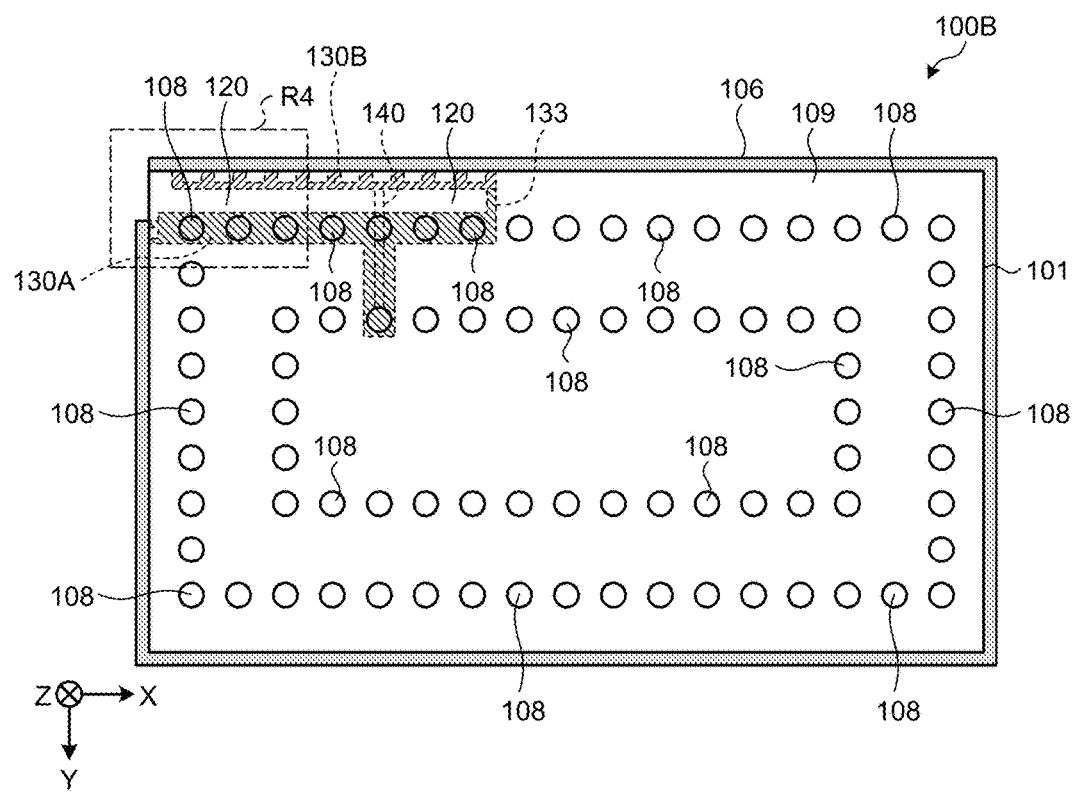
FIG. 11 is a planar view, when viewed from the reverse surface side, of the interposer of a wireless device according to a second embodiment.
Figure 12:
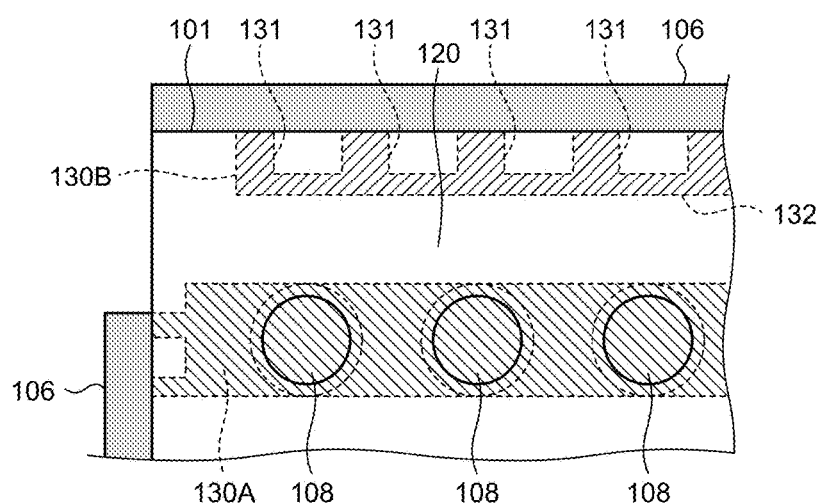
FIG. 12 is a diagram illustrating an R4 portion, which is illustrated in FIG. 11, in an enlarged manner.

Explained below with reference to FIGS. 11 and 12 is a wireless device 100B according to a second embodiment. FIG. 11 is a planar view, when viewed from the reverse surface side, of the interposer 101 of the wireless device 100B according to the second embodiment. FIG. 12 is a diagram illustrating an R4 portion, which is illustrated in FIG. 11, in an enlarged manner. Meanwhile, a perspective view and a cross-sectional view of the wireless device 100B according to the second embodiment are identical to the respective views of the wireless device 100A according to the first embodiment (see FIGS. 1 and 2). Hence, those diagrams are not illustrated.

The wireless device 100B according to the second embodiment has an identical basic structure to that of the wireless device 100A according to the first embodiment. However, the slot antenna 120 that is disposed in a conductive layer of the interposer 101 has a different configuration to that in the wireless device 100A according to the first embodiment. That is, in the first embodiment, the insulating portion between the conductor pattern 130, which has ground potential and which is disposed at a distance from the side surface of the interposer 101, and the side surface portion of the conductive film 106 constitutes the slot antenna 120 in a conductive layer of the interposer 101. In contrast, in the second embodiment, as illustrated in FIGS. 11 and 12, the insulating portion between a first conductor pattern 130A, which has ground potential and which is disposed at a distance from the side surface of the interposer 101, and a comb-shaped second conductor pattern 130B, which is disposed adjacent to the side surface of the interposer 101 and which is electrically connected to the side surface portion of the conductive film 106, constitute the slot antenna 120 in a conductive layer of the interposer 101.

The first conductor pattern 130A can have an identical configuration to that of the conductor pattern 130 according to the first embodiment. That is, in the second embodiment too, in an identical manner to the first embodiment, from among a plurality of electrodes 108 disposed in the conductive layer formed at the side of the reverse surface of the interposer 101, the electrodes 108 positioned in the vicinity of the slot antenna 120 can be allocated as ground pins, so that the first conductor pattern 130A that has ground potential and that makes contact with one end in the width direction of the slot antenna 120 can be disposed in an overlapping manner with the electrodes 108 positioned in the vicinity of the slot antenna 120. That is, the electrodes 108 positioned in the vicinity of the slot antenna 120 can double as a part of the first conductor pattern 130A having ground potential.

As illustrated in FIG. 12, the second conductor pattern 130B that makes contact with the other end in the width direction of the slot antenna 120 is a comb-shaped conductor pattern in which a number of comb blade portions 131, which extend from a base portion 132, have their leading ends placed in contact with the side surface portion of the conductive film 106. As a result of placing the leading ends of a number of comb blade portions 131 in contact with the side surface portion of the conductive film 106, the second conductor pattern 130B gets electrically connected to the side surface portion of the conductive film 106. Moreover, as illustrated in FIG. 11, the second conductor pattern 130B is connected to the first conductor pattern 130A via a link 133, and has ground potential in an identical manner to the first conductor pattern 130A.

In the second embodiment too, in an identical manner to the first embodiment, the first conductor pattern 130A that makes contact with one end in the width direction of the slot antenna 120 can be disposed in an overlapping manner with the electrodes 108 positioned in the vicinity of the slot antenna 120. Hence, the shortest distance between an end in the width direction of the slot antenna 120 and the electrodes 108 can be set to be smaller than the sum of the minimum line width and the minimum line space of the interposer 101; and the width of the slot antenna 120 can be increased by the equivalent amount and the radiation characteristic thereof can be enhanced.

However, in the second embodiment, the second conductor pattern 130B is present in between the slot antenna 120, which is disposed in a conductive layer of the interposer 101, and the side surface portion of the conductive film 106. Hence, as compared to the first embodiment, the width of the slot antenna 120 gets limited by the amount equal to the second conductor pattern 130B. On the other hand, as a result of disposing the second conductor pattern 130B in between the slot antenna 120 and the side surface portion of the conductive film 106, there is an advantage of being able to effectively hold down an unfavorable situation in which the misalignment occurring at the time of forming the conductor patterns (the first conductor pattern 130A and the second conductor pattern 130B) in a conductive layer of the interposer 101 causes variation in the width of the slot antenna 120 thereby resulting in changes in the characteristics thereof. That is, as is the case in the second embodiment, when the non-conductive portion between the first conductor pattern 130A and the second conductor pattern 130B constitutes the slot antenna 120, even if there is some misalignment at the time of forming the conductor patterns, the width of the slot antenna 120 is maintained constant. Hence, changes in the characteristics of the slot antenna 120, which are attributed to the variation in the width thereof, can be held down in an effective manner.

Moreover, in the second embodiment, because of the comb-like shape of the second conductor pattern 130B, in the dicing process for obtaining the interposer 101, it becomes possible to hold down an unfavorable situation in which the second conductor pattern 130B comes off. Generally, the interposer 101 is obtained by performing dicing (singulation) of a large-diameter substrate formed by arranging a number of interposers 101. However, if the second conductor pattern 130B is a solid pattern, for example; then there is concern that, in the dicing process, the second conductor pattern 130B gets drawn into dicing blades and comes off. In contrast, if the second conductor pattern 130B is configured to have the comb-like shape as explained above, there is a decrease in the amount of stress applied on the second conductor pattern 130B in the dicing process, and the second conductor pattern 130B can be prevented from coming off. Moreover, in the second conductor pattern 130B, the leading ends of a large number of comb blade portions 131 are placed in contact with the side surface portion of conductive film 106 as explained above. That enables reliable establishment of electrical connection with the side surface of the conductive film 106.

Meanwhile, as explained in the first modification of the first embodiment, in the second embodiment too, a part of the slot antenna 120 need not be always disposed in the conductive layer formed at the side of the reverse surface of the interposer 101, but can be disposed in any one of the conductive layers such as the conductive layer at the side of the component mounting surface of the interposer 101. Moreover, as explained in the second modification of the first embodiment, in the second embodiment too, the configuration can be such that the width of the slot antenna 120 disposed in a conductive layer of the interposer 101 is varied. Furthermore, as explained in the third modification of the first embodiment, in the second embodiment too, the slot antenna 120 disposed in a conductive layer of the interposer 101 can have various shapes, such as being bent and turned back midway along the length direction. Moreover, as explained in the fourth modification of the first embodiment, in the second embodiment too, the configuration can be such that the slot antenna 120 is disposed in only one of the conductive layers of the interposer 101.

According to at least one of the embodiments described above, downsizing of the interposer 101 can be achieved while maintaining the radiation characteristic of the slot antenna 120.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A wireless device comprising:
an interposer that includes conductive layers disposed at least at a side of a component mounting surface and a side of a reverse surface which is opposite to the component mounting surface;
a semiconductor chip that is mounted on the component mounting surface of the interposer and that includes a built-in transceiving circuit;
a plurality of electrodes that are disposed in a conductive layer disposed at the side of the reverse surface of the interposer so as to be electrically connected to an outside of the wireless device; and
a slot antenna, at least a portion of the slot antenna disposed in at least one of the conductive layers of the interposer, wherein
a shortest distance between an end in a width direction of the slot antenna and the plurality of electrodes is smaller than a sum of a minimum line width and a minimum line space of the interposer.

2. The device according to claim 1, further comprising:
a non-conductor that is placed on the component mounting surface of the interposer and that seals the semiconductor chip; and
a conductive film that covers a surface of the non-conductor and a side surface of the interposer, and that is electrically connected to at least one of the conductive layers of the interposer, wherein
the slot antenna is disposed across a principal surface portion of the conductive film which faces the component mounting surface of the interposer, a side surface portion of the conductive film which faces the side surface of the interposer, and one of the conductive layers of the interposer.

3. The device according to claim 2, wherein the portion of the slot antenna disposed in at least one of the conductive layers of the interposer is formed of a insulating portion between a conductor pattern, which is formed in the at least one of the conductive layers and is separated from the side surface of the interposer, and the side surface portion of the conductive film.

4. The device according to claim 2, wherein the portion of the slot antenna disposed in at least one of the conductive layers of the interposer is formed of a non-conductive portion between a first conductor pattern, which is disposed in the at least one of the conductive layers and is separated from the side surface of the interposer, and a comb-shaped second conductor pattern, which is disposed in the at least one of the conductive layers and is adjacent to the side surface of the interposer and which is electrically connected to the side surface portion of the conductive film.

5. The device according to claim 1, wherein
the plurality of electrodes includes an electrode used for communicating a signal with the outside of the wireless device and an electrode having a ground potential, and
at least the portion of the slot antenna disposed in at least one of the conductive layers of the interposer is disposed from neighborhood of the electrode having the ground potential to neighborhood of the electrodes used for communicating the signal, and a width of the slot antenna at a position closest to the electrode having the ground potential is greater than a width at a position closest to the electrodes used for communicating the signal.

* * * * *